United States Patent [19]
Baum et al.

[11] Patent Number: 6,143,191
[45] Date of Patent: Nov. 7, 2000

[54] METHOD FOR ETCH FABRICATION OF IRIDIUM-BASED ELECTRODE STRUCTURES

[75] Inventors: Thomas H. Baum, New Fairfield; Frank Dimeo, Jr., New Milford, both of Conn.

[73] Assignee: Advanced Technology Materials, Inc., Danbury, Conn.

[21] Appl. No.: 08/966,796

[22] Filed: Nov. 10, 1997

[51] Int. Cl.$^7$ ........................................ B44C 1/22
[52] U.S. Cl. .................. 216/63; 216/64; 216/65; 216/66; 216/67; 216/75; 216/76
[58] Field of Search .................... 216/2, 63, 64, 216/65, 66, 67, 75, 76

[56] References Cited

U.S. PATENT DOCUMENTS

| | | | |
|---|---|---|---|
| 4,026,742 | 5/1977 | Fujino | 156/643 |
| 5,705,443 | 1/1998 | Stauf et al. | 438/722 |

OTHER PUBLICATIONS

Koteki, D.E. "A Review of High Dielectric materials for DRAM Capacitors," Integ. Ferroelectric, 16, pp. 1–19 (1997).

Jeon, et al. "Thermal Stability of Ir/Polycrystalline–Si Structure for Bottom Electrode of Integrated Ferroelectric Capacitors," Applied Phys. Letter, 71(4), pp. 467–469 (1997).

Williams, et al. "Etch Rates for Micromachining Processing," Journal of Microelectromechanical Systems, vol. 5, No. 4, Dec. 1996, pp. 256–269.

Vugts, et al. "Si/XeF$_2$ Etching–Temperature Dependence," J. Vac. Sci. Tech. A, 14(5), pp. 2766–2774 (1996).

Floy, et al. "Gas Phase Silicon Micromachining with Xenon Difluoride," SPIE Proceedings, 2671, pp. 117–128 (1995).

*Primary Examiner*—Edward J. Cain
*Attorney, Agent, or Firm*—Steven J. Hultquist; Oliver A.M. Zitzmann

[57] ABSTRACT

A method of forming an iridium-based electrode structure on a substrate, from an iridium-containing precursor thereof which is decomposed to deposit iridium on the substrate. The iridium-based material is formed on the substrate in a desired environment, e.g., an oxidizing ambient environment which may for example contain an oxidizing gas such as oxygen, ozone, air, or nitrogen oxide, or alternatively a reducing environment containing a reducing agent such as $H_2$, CO or $NH_3$. The iridium deposited on the substrate is contacted with an etching reagent such as halogen-based etch species (e.g., $Cl_2$, $Br_2$, $F_2$, $CCl_4$, $Si_2F_6$, $SiCl_4$, $NF_3$, $C_2F_6$, $SF_6$, or $CF_4$) formed by exposing halogen to light, laser radiation, plasma, or ion beam, or alternatively with $XeF_2$, for sufficient time and under sufficient conditions to etch the deposited iridium-based material and form the etched iridium-based electrode structure. The electrode structure may then have a dielectric or ferroelectric material deposited thereon, for fabrication of thin film capacitor semiconductor devices such as DRAMs, FeRAMs, hybrid systems, smart cards and communication systems.

25 Claims, No Drawings

METHOD FOR ETCH FABRICATION OF IRIDIUM-BASED ELECTRODE STRUCTURES

CROSS-REFERENCE TO RELATED APPLICATION

This application is concurrently filed with U.S. patent application Ser. No. 08/966,797 filed Nov. 10, 1997 in the names of Thomas H. Baum and Chong-Ying Xu for "Method of Fabricating Iridium-Based Materials and Structures on Substrates, and Iridium Source Reagents Therefor," the disclosure of which hereby is incorporated herein in its entirety.

GOVERNMENT RIGHTS IN INVENTION

The invention was made in the performance of the U.S. Army Space and Missile Defense Command, Contract Number DAAH01 96-C R035. The government has certain rights in the invention.

BACKGROUND OF THE INVENTION

1. Field Of The Invention

This invention relates to a method of fabricating iridium-containing material structures on substrates, such as Ir-based electrode structures for microelectronic devices and subassemblies.

2. Description of the Related Art

Conducting metal and metal oxide electrodes are preferred for the integration of devices based on perovskite and high dielectric constant oxide materials. The electrode identity may influence the crystallographic orientation, the growth of the capacitor film or other device structures formed over or on the electrode, the leakage properties of the device structure, the stability of the device toward temperature and humidity, and the long term reliability of the device. The incorporation and use of the electrode requires that the electrode material be easily deposited in high purity, easily patterned and etched, and readily integrated for complete device build and performance. The importance of the electrode cannot be overstated, relative to device performance and ease of fabrication of the overall device structure.

Iridium (Ir) and iridium oxide ($IrO_2$) are of great interest for use as electrode materials in both dynamic random access memories (DRAMs) and for ferroelectric-based memory devices (FRAMs) which incorporate perovskite metal oxide thin-films as the capacitor layer.

The advantages of Ir over other possible electrode materials include ease of deposition including the formation of the electrode using chemical vapor deposition (CVD), the ability to "dry etch" the material, the ability to form a stable conducting oxide at high temperatures in an oxidizing environment, the ability to convert $IrO_2$ back to Ir metal at 350° C. in forming gas, and the ability to operate stably at high temperatures in a working device with a high degree of reliability.

The deposition and processing of Ir-based electrodes is highly desirable based on these advantages. The metal displays a resistivity of 5.3 $\mu\omega$-cm at 20° C. and $IrO_2$ is highly conducting with a reported resistivity of 100 $\mu\Omega$-cm. The formation of $IrO_2$ occurs only at elevated temperatures (>550° C.) in $O_2$ and is a superior material for the deposition of complex oxide for dielectric or ferroelectric capacitors. Further, during the high temperature CVD process for the growth of these capacitors, the formation of $IrO_2$ can be advantageous for limiting inter-diffusion, as for example by acting as a diffusion barrier to oxidation of conducting polysilicon vias or plugs. $IrO_2$ is a material which therefore has many advantages in forming a robust, low-leakage electrode for reliable device fabrication.

Based on the need for Ir-based electrodes, a facile etching method for Ir is critical to commercial incorporation of Ir into manufacturing, enabling the use of CVD techniques which are especially desired for electrode structures with dimensional characteristics below 0.5 micron. In order to obtain useful electrode structures, it is generally necessary to etch the deposited Ir-based material, to form bottom or top electrode elements of the desired dimensional and positional character. The etching method should therefore be readily employed to define useful electrode patterns of the desired critical dimensions. A commercially useful "dry etch" methodology applicable to Ir-based electrodes would permit such electrodes to be economically fabricated for use in a variety of microelectronic applications, structures and devices, and would constitute a substantial advance in the art relative to conventional use of platinum electrodes.

The art has variously disclosed the chemical vapor deposition of iridium for the manufacture of electronic devices in a reducing atmosphere such as hydrogen gas environment. The art has taught the use of such reducing atmosphere for the purpose of achieving the deposition of element metal iridium for electrodes in applications in which high temperature dielectric materials (e.g., SBT, BST, PZT, PLZT, PNZT, $LaCaMnO_3$, etc., where SBT=strontium bismuth tantalate, BST=barium strontium titanate, PZT=lead zirconium titantate, PLZT=lead lanthanum zirconium titanate, and PNZT=lead niobium zirconium titanate) are deposited on the electrode, to minimize the possibility of degradation of the electrode in such applications.

In the context of the foregoing circumstances, the art has sought improvements in process technology for the formation of semiconductor and ferroelectric structures which employ Ir electrodes, specifically as associated with the fabrication of complex dielectric and ferroelectric material layers and structures.

It is an object of the present invention to provide a process for the formation of iridiumbased electrodes which achieves a material simplification in fabrication efficiency and cost, and which achieves an electrode structure for dielectric structures which is highly advantageous for integration, efficient and readily fabricated.

It is another object of the invention to provide a ready and simply applied method for the patterning and fabrication of Ir-containing structures such as electrodes or contacts onto substrates.

It is yet another object of the invention to provide a simplified method for the fabrication of metal oxide thin film capacitor structures including iridium, iridium oxide or iridium-containing electrode elements.

Other objects and advantages of the present invention will be more fully apparent from the ensuing disclosure and appended claims.

SUMMARY OF THE INVENTION

The present invention relates to a method for fabricating a microelectronic device or structure including an Ir-based electrode, comprising the "dry etching" of Ir-based material formed (by any of a variety of deposition techniques and formation environments) on a substrate, to thereby yield an electrode structure, and to device structures and subassemblies employing such dry-etched Ir-based electrode structures.

As used herein, the term "Ir-based" or "iridium-based" refers broadly to elemental iridium, iridium oxide and iridium-containing material compositions including iridium alloys. The term "dry etch" refers to etching which is carried out using gaseous reagents, as opposed to wet-etching methods in which liquid-phase reagents are employed to effect material removal from a deposited metal thin film, or layer of material.

In one aspect, the invention relates to a method of forming an iridium-containing structure on a substrate, from an iridium-containing precursor thereof which is decomposed to deposit iridium on the substrate, such method comprising:

decomposing the precursor and depositing iridium-based material on the substrate; and contacting the deposited iridium-based material with an etching reagent selected from the group consisting of:
(i) halogen etch species formed by exposing halogen to an energizingly effective agent selected from the group consisting of light, laser radiation, plasma, and ion beam, to yield energized halogen etch species which are effective in etching upon contact with the iridium-based material; and
(ii) $XeF_2$, for sufficient time and under sufficient conditions to etch the deposited iridium-based material and form an etched iridium-based material structure.

The deposition of iridium-based material on the substrate may be carried out in any suitable manner and by any appropriate techniques of the art, including sol-gel, chemical vapor deposition (CVD), assisted CVD (e.g., plasma-assisted or ion-assisted CVD), or physical deposition methods such as sputtering, evaporation, rapid thermal processing, molecular beam epitaxy, ion plating, electrochemical plating or any other suitable deposition technique known to those skilled in the art. The environment and process conditions for such deposition may be readily determined within the skill of the art. As hereinafter described in greater detail, the deposition environment may comprise a reducing atmosphere, at ambient or other conditions; alternatively, the deposition of the iridium-based material on the substrate may be carried out in an oxidizing environment, e.g., an oxidizing ambient environment.

As used herein, the term "oxidizing ambient environment" means an environment including oxygen-containing gas, such as oxygen, ozone, air, nitrogen oxide (NO), or the like. Such oxidizing atmosphere may be provided in a deposition chamber or reaction vessel in which the deposition is carried out, and enables the formation of iridium oxide on the substrate. Accordingly, the deposition may be conducted in an ambient air environment, thereby simplifying the formation of the iridium-containing film on the substrate. In an alternate embodiment, $IrO_2$ may be formed in a post-deposition process from Ir metal by treatment in an oxidizing environment.

Prior to the etch contacting of the deposited Ir-based material on the substrate, the Ir-based material may be masked or patterned, by conventional photoresist or other patterning techniques, to form a lithographically or otherwise defined pattern for subsequent processing.

As used herein, the term "halogen" is intended to be broadly construed to include elemental halogen species per se, e.g., $F_2$, $Cl_2$, $Br_2$, and $I_2$, as well as halogen-containing compounds and compositions, e.g., $SiF_4$, $Si_2F_6$, $SiCl_4$, $NF_3$, $C_2F_6$, $SF_6$, $CF_4$, $CCl_4$, etc.

The Ir precursor material may be of any suitable composition and type. In preferred practice of the present invention, the precursor may suitably comprise a Lewis base-stabilized β-diketonate iridium composition or a Lewis base-stabilized β-ketoiminate composition, as hereafter more fully described, and as disclosed and claimed in co-pending United States patent application Ser. No. 08/966, 797 filed concurrently herewith in the names of Thomas H. Baum and Chong-Ying Xu for "Method of Fabricating Iridium-Based Materials and Structures on Substrates, and Iridium Source Reagents Therefor."

Examples of dry etch reagents for etching the iridium-containing film, e.g., to form an electrode or other patterned structure on the substrate, include halogen species such as chlorine, bromine or fluorine (for example, fluorine gas or atomic fluorine), halogen-based plasmas (e.g., using $SiF_4$, $Si_2F_6$, $SiCl_4$, NF3, $C_2F_6$, $SF_6$, $CF_4$), and/or preferably, $XeF_2$. The etching step may be carried out at any suitable process conditions, e.g., room temperature conditions involving the sublimation of $XeF_2$, or room temperature etch of the Ir-based material with halogen etching species.

In such dry etching of the deposited iridium oxide film, the etch rates may optionally be enhanced through the use of Lewis-based adducts or electron back-bonding species such as carbon monoxide, trifluorophosphine, or trialkylphosphines. Thus, the step of contacting the iridium-based material with an etching reagent may be carried out with a co-reactant to assist in the volatilization and removal of Ir(I)X and/or Ir(III)$X_3$ species from the iridium-based material on the substrate.

When $XeF_2$ is used as the etch agent, the etching process may also be enhanced by use of inert gases, and ion beam-assisted, plasma-assisted or photo-assisted techniques.

In yet another aspect of the present invention, the iridium-containing film subsequent to its formation as an electrode structure may have deposited thereon a high temperature dielectric and/or ferroelectric material. An oxidizing ambient environment may be employed for the deposition of the iridium-containing film and such oxidizing ambient atmosphere may also be used during the deposition of the oxide dielectric/ferroelectric.

It may therefore be unnecessary to purge the chamber of a reducing atmosphere, or to transfer the substrate article bearing the iridium-containing film from the iridium deposition chamber to a dielectric/ferroelectric deposition chamber, as has been done in the prior art to accommodate the usage of hydrogen or other reducing gas (forming gas) atmospheres in the iridium electrode formation step.

The method of this invention therefore achieves a substantial simplification of the procedure for forming a capacitor or other microelectronic device in which the iridium-containing electrode is overcoated with a dielectric or ferroelectric material.

In addition to the formation of a bottom Ir-based electrode structure as described above, it is also contemplated that the invention may be practiced with the formation and etching of a deposited Ir-based material as a top Ir-based electrode structure. For example, the Ir-based material may be deposited on a high temperature dielectric material or ferroelectric material, e.g., BST (barium strontium titanate). Such BST material overlaid with Ir-based material in accordance with the invention permits the Ir-based material to be employed as a top electrode structural material, as well as a hard mask layer to pattern the underlying BST, thereby producing a self-aligned capacitive electrode structure.

In a specific embodiment of the invention, the iridium-coated substrate may be lithographically patterned, etched, and then stripped of the polymeric resist, cleaned and used for the deposition of oxide capacitors (either high k dielectric or ferroelectric). The iridium-based material on the substrate may for example comprise an iridium oxide electrode element overlaid by a high temperature dielectric, e.g., SBT, PZT, BST, PLZT, PNZT, LaCaMnO$_3$, etc., wherein the electrode is conductively operative in relation to the high temperature dielectric. As used herein, high temperature dielectric refers to a dielectric material deposited on the (substrate-bearing) electrode at a temperature above about 300° C. By way of example, dielectric films of lead zirconium titanate (PZT) are typically deposited at temperatures on the order of 500–600° C. and strontium bismuth tantalate (SBT) films are typically deposited near 400° C. and annealed to the Aurivillius phase above 650° C.

Other aspects, features and embodiments of the invention will be more fully apparent from the ensuing disclosure and appended claims.

DETAILED DESCRIPTION OF THE INVENTION, AND PREFERRED EMBODIMENTS THEREOF

The present invention is based on the discovery that Ir-based electrode structures can be readily formed by "dry" etch processing using etching agents such as halogen-based etch species and/or XeF$_2$ after deposition of Ir-based material.

Iridium may be deposited on the substrate in the method of the present invention in any suitable manner, including chemical vapor deposition (CVD), assisted CVD, e.g., plasma-assisted CVD, physical vapor deposition (PVD), ion-assisted plating, liquid delivery, sputtering, ablation, or any other suitable technique known in the art for deposition of metal on a substrate. Among the foregoing, chemical vapor deposition is preferred when the iridium-based top electrode structures being formed have critical dimensions below about 0.5 microns. Bottom electrode structures may also be fabricated economically using a deposition and etch process as described herein.

In the deposition of Ir-based material on a substrate by metalorganic chemical vapor deposition (MOCVD), the precursor for the CVD of the iridium component may be any suitable iridium precursor compound, complex or composition which is advantageous for yielding iridium for deposition on the substrate. The iridium precursor may for example comprise a Lewis base-stabilized β-diketonate iridium composition or a Lewis base-stabilized β-ketoiminate composition, as more fully described in co-filed U.S. Patent application Ser. No. 08/966,797 in the names of Thomas H. Baum and Chong-Ying Xu for "Method of Fabricating Iridium-Based Materials and Structures on Substrates, and Iridium Source Reagents Therefor."

In CVD-based embodiments of the present invention, either a bubbler or organic solution liquid delivery can be utilized for the chemical vapor deposition of the Ir/IrO$_2$ thin film. The specific precursor may be suitably optimized for the delivery and transport of the precursor to the CVD reactor. The precursor is decomposed in the presence of a reductant (e.g., H$_2$) or an oxidant (O$_2$, O$_3$, N$_2$O) to preferentially deposit the metal Ir (at a temperature of <500° C.) or the oxide, IrO$_2$ (at a temperature of >550 ° C.). In some applications, the formation of a bi-layered Ir/IrO$_2$ film may be preferred.

Etching of the deposited Ir-based material is carried out by contacting the deposited iridium-based material with an etching reagent. The etching reagent may for example comprise at least one of (i) halogen etch species formed by exposing halogen, e.g., Cl$_2$, CCl$_4$, a Freon√ composition, SiF$_4$, Si$_2$F$_6$, SiCl$_4$, NF$_3$, C$_2$F$_6$, SF$_6$, or CF$_4$, to an energizingly effective agent selected from the group consisting of light, laser radiation, plasma, and ion beam, to yield energized halogen etch species which are effective in etching upon contact with the iridium-based material, and (ii) XeF$_2$. The contacting of the deposited Ir-based material is carried out for sufficient time and under sufficient conditions to etch the deposited iridium-based material and form an etched iridium-based material structure. The time and contacting conditions may be readily determined by those of ordinary skill in the art, by the simple expedient of empirical determination of the etching of the deposited Ir-based material while varying the time and/or contacting conditions (such as temperature, pressure, concentration (partial pressure) of the etching agent) to provide a desired etching result.

Etching of Ir and IrO$_2$ in the practice of the invention, after the initial formation of the iridium-containing film, may be carried out with the use of halogen-based systems, such as chlorine, bromine, and fluorine based plasma or ion beam etch chemistries. The formation of halogens of Ir(I) and Ir(III) can be utilized to etch and pattern electrodes for semiconductor and ferroelectric device applications. In systems where IrO$_2$ is present, the use of either a reducing pre-treatment (to return the iridium oxide to Ir metal) or the use of fluorine etchants may be preferred. The formation and removal of etch by-products depends on the volatility of the halide species. Halogen-based plasmas may advantageously be employed. The addition of stabilizing co-reactants (e.g., CO, PF$_3$, alkenes, or fluoroalkenes) may usefully be employed to facilitate the removal and etching of the materials.

Alternatively, XeF$_2$ may be employed as an etchant for the deposited Ir-based material.

The etching may be carried out at room temperature or under any other etch conditions suitable for effecting the etch removal of the applied Ir-containing material from the substrate on which it has been formed.

For example, the etching reagent may comprise XeF$_2$ sublimed at room temperature or at elevated temperature.

The etch process may be carried out with enhancement of the rate of of etching, by conducting such etching in the presence of an etch-enhancing agent such as Lewis-based adducts or electron back-bonding species. Specific etch-enhancing agents may include carbon monoxide, trifluorophosphine, or trialkylphosphines whose alkyl moiety is selected from C$_1$–C$_8$ alkyl, alkenes, fluoroalkenes, or any other suitable materials.

When the etching agent comprises XeF$_2$, the rate of of etching may be further enhanced by conducting such etching in the presence of an etch-enhancing condition such as the presence of inert gas, the use of ion beam-assisted or plasma-assisted etching, or the use of photo-assisted etching.

Etch enhancing agents such as carbon monoxide, trifluorophophine, or trialkyl phosphines accelerate the rate of etching by enhancing the volatility of the produced etch by-products and iridium halides.

For example, in the etching of the Ir-containing film on the substrate, the removal rate for the process may be advantageously accelerated by the presence of carbon monoxide (CO). The rates are strongly dependent upon the gas-phase partial pressure of the reactants in elevated substrate temperature regimes (e.g., 725–975° C.). The presence of CO may serve to enhance the reactant volatility through the formation of (CO)$_x$IrX$_3$ (where X=Cl, Br) and for Ir(Cl)$_4$. IrF$_6$ may also be employed for such purpose. These materials can be used advantageously for etching Ir in halogen-based plasmas, ion beams and in hybrid etching schemes.

The formation and removal of etch by-products relies upon the volatility of the Ir(halide)$_x$ species. The addition of Lewis base ligands may facilitate the removal and etching of the iridium electrodes via metal center coordination and increased volatility of the iridium halide etch by-products.

In some instances, it may be desirable to convert the iridium oxide material deposited on the substrate to a pure iridium metal for a specific fabrication or device application. In such instance, the deposited film of iridium oxide may be exposed to a reducing gas, such as hydrogen, forming gas, CO, ROH, etc. to effect such conversion.

After its formation and any additional patterning, the iridium-containing electrode may have deposited thereon a high temperature dielectric and/or ferroelectric material. If the iridium-containing material is deposited in an oxidizing ambient environment, the deposition of the high temperature dielectric and/or ferroelectric material may be deposited in the same oxidizing ambient environment employed for the deposition of the iridium-containing film.

In addition to formation of a bottom Ir-based electrode structures, the invention may be practiced with the formation and etching of a deposited Ir-based material as a top Ir-based electrode structure. Further, this etching process may be used to clean an Ir CVD chamber to reduce particle formation and contamination therein. The Ir-based material may be deposited on or over a high temperature dielectric material or ferroelectric Ematerial, so that the Ir-based material serves as a top electrode structural material, as well as a hard mask layer to pattern the underlying dielectric or ferroelectric material, thereby yielding a self-aligned capacitive electrode structure.

The dielectric or ferroelectric material may comprise any suitable material for the specific end use or application being contemplated. Examples of potentially useful materials include SBT, PZT, BST, PLZT, PNZT, and LaCaMnO$_3$.

The iridium films deposited in the practice of the present invention may therefore be utilized for the formation of electrode and other elements of semiconductor devices, such as for example DRAMs, FRAMs, hybrid systems, smart cards and communication systems, as well as any other applications in which the thin films of iridium and/or iridium oxide, or combinations thereof, are advantageously employed.

The features and advantages of the invention are more fully shown by the following example, wherein all parts and percentages are by weight, unless otherwise expressly stated.

EXAMPLE I

After sputter formation of a thick iridium film on a thin MgO adhesion layer on a silicon substrate and patterning of the iridium film with photoresist, the chamber containing the substrate coated with the Ir-based film was backfilled with XeF$_2$ gas to a pressure of between 200 and 300 millitorr. The coated substrate article was exposed to the XeF$_2$ gas for a period of 30–60 seconds, and the chamber then was evacuated to less than 1 millitorr pressure for 60 seconds or more. The cycle was then repeated with fresh XeF$_2$ gas. The XeF$_2$ gas was provided by sublimation of a solid source material at room temperature with a single outlet. The sample to be etched was mounted on a polytetrafluoroethylene plate and held at room temperature. Eight cycles of this exposure to the XeF$_2$ gas completely removed the Ir, leaving behind a step edge of 190 nanometers. The Ir film etched in this example was nominally 1000 (±400) Angstroms. EDS analysis confirmed the removal of Ir from the exposed areas.

Subsequent tests showed that two cycles of exposure to the XeF$_2$ gas was sufficient to etch >95% of the Ir film. The photoresist was then removed from the substrate leaving patterned electrode contacts of Ir.

While the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art. The invention therefore is to be broadly construed, consistent with the claims hereafter set forth.

What is claimed is:

1. A method of fabricating an iridium-based material structure from iridium-based material on a substrate, comprising:

contacting the iridium-based material with an etching reagent comprising XeF$_2$, for sufficient time and under sufficient conditions to etch the deposited iridium-based material and form an etched iridium-based material structure.

2. A method according to claim 1, wherein the iridium-based material is formed on the substrate by a deposition process selected from the group consisting of: sol-gel, chemical vapor deposition (CVD), plasma-assisted CVD, ion beam-assisted CVD, sputtering, evaporation, rapid thermal processing, molecular beam epitaxy, and ion plating.

3. A method according to claim 1, wherein the iridium-based material is formed on the substrate in an oxidizing ambient environment.

4. A method according to claim 1, wherein the oxidizing ambient environment comprises an ambient air environment.

5. A method according to claim 1, wherein the iridium-based material comprises Ir.

6. A method according to claim 1, wherein the iridium-based material comprises IrO$_2$.

7. A method according to claim 1, wherein the step of contacting the iridium-based material with an etching reagent is carried out with a co-reactant to assist in the volatilization and removal of Ir(I)X and/or Ir(III)X$_3$ species from the iridium-based material.

8. A method according to claim 1, wherein the etching is carried out at room temperature.

9. A method according to claim 1, wherein the etching is carried out above room temperature.

10. A method according to claim 1, wherein the etching is carried out below room temperature.

11. A method according to claim 1, wherein the etching reagent comprises XeF$_2$ sublimed at room temperature.

12. A method of fabricating an iridium-based material structure from iridium-based material on a substrate, comprising:

contacting the iridium-based material with an etching reagent selected from the group consisting of:
(i) halogen etch species formed by exposing a halogen to an energizingly effective agent selected from the group consisting of light, laser radiation, plasma, and ion beam, to yield energized halogen etch species which are effective in etching upon contact with the iridium-based material; and
(ii) XeF$_2$, for sufficient time and under sufficient conditions to etch the deposited iridium-based material and form an etched iridium-based material structure, further comprising enhancing the rate of of etching by conducting such etching in the presence of an etch-enhancing agent selected from the group consisting of Lewis-based adducts and electron back-bonding species.

13. A method of fabricating an iridium-based material structure from iridium-based material on a substrate comprising:
contacting the iridium-based material with an etching reagent selected from the group consisting of:
(i) halogen etch species formed by exposing a halogen to an energizingly effective agent selected from the group consisting of light, laser radiation, plasma, and ion beam, to yield energized halogen etch species which are effective in etching upon contact with the iridium-based material: and
(ii) $XeF_2$,
for sufficient time and under sufficient conditions to etch the deposited iridium-based material and form an etched iridium-based material structure, further comprising enhancing the rate of of etching by conducting such etching in the presence of an etch-enhancing agent selected from the group consisting of carbon monoxide, trifluorophosphine, and trialkylphosphines whose alkyl moiety is selected from $C_1$–$C_8$ alkyl, alkenes and perfluoroalkenes.

14. A method of fabricating an iridium-based material structure from iridium-based material on a substrate comprising:
contacting the iridium-based material with an etching agent comprising $XeF_2$, further comprising enhancing the rate of etching by conducting such etching in the presence of an etch-enhancing condition selected from the group consisting of the presence of inert gas, plasma-assisted etching, ion beam-assisted etching, and photo-assisted etching.

15. A method according to claim 1, further comprising depositing over the etched iridium-based material structure a material selected from the group consisting of dielectric and ferroelectric materials.

16. A method according to claim 15, wherein the dielectric or ferroelectric material deposited over the etched iridium-based material structure is deposited in the same oxidizing ambient environment as employed for the deposition of the iridium-based material.

17. A method according to claim 1, wherein the substrate comprises a dielectric material or ferroelectric material.

18. A method according to claim 1, wherein the substrate comprises BST.

19. A method according to claim 18, wherein the iridium-based material constitutes a top electrode structural material and provides a hard mask layer for patterning the BST thereunder during said etching to yield a self-aligned capacitive electrode structure.

20. A method of fabricating an iridium-based electrode structure on a substrate, comprising:
forming an iridium-based material on the substrate at an elevated substrate temperature;
lithographically patterning the deposited iridium-based material on the substrate to a desired electrode pattern using a resist applied to the substrate and lithographically developed thereon;
contacting the deposited iridium-based material with an etching reagent comprising $XeF_2$,
for sufficient time and under sufficient conditions to etch the deposited iridium-based material and form the etched iridium-based electrode structure.

21. A method according to claim 20, wherein the iridium-based material is deposited on a dielectric or ferroelectric material substrate, to form a top electrode structure thereon.

22. A method according to claim 21, wherein the dielectric or ferroelectric material substrate comprises a material selected from the group consisting of SBT, PZT, BST, PLZT, PNZT, and $LaCaMnO_3$.

23. A method according to claim 21, wherein the dielectric or ferroelectric material comprises BST or SBT, respectively.

24. A method according to claim 20, wherein a dielectric or ferroelectric material is deposited over the etched iridium-based electrode structure.

25. A method according to claim 24, wherein the dielectric or ferroelectric material substrate comprises a material selected from the group consisting of SBT, PZT, BST, PLZT, PNZT, and $LaCaMnO_3$.

* * * * *

UNITED STATES PATENT AND TRADEMARK OFFICE
CERTIFICATE OF CORRECTION

PATENT NO. : 6,143,191
DATED : November 7, 2000
INVENTOR(S) : Thomas H. Baum, Frank Dimeo, Jr.

It is certified that error appears in the above-identified patent and that said Letters Patent is hereby corrected as shown below:

Column 1:
Line 60, change "5.3μω-cm" to -- $5.3\mu\Omega$-cm --.

Column 4;
Line 14, change "NF3" to -- $NF_3$ --.

Column 7:
Line 27 change "Ematerial" to --material--.
Line 55-56, delete excess spacing between "gas" and "for".

Signed and Sealed this

Tenth Day of July, 2001

*Attest:*

Nicholas P. Godici

NICHOLAS P. GODICI
*Attesting Officer*    *Acting Director of the United States Patent and Trademark Office*